United States Patent
Watanabe et al.

(10) Patent No.: US 7,475,319 B2
(45) Date of Patent: Jan. 6, 2009

(54) THRESHOLD VOLTAGE CONTROL APPARATUS, TEST APPARATUS, AND CIRCUIT DEVICE

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 350 days.

(21) Appl. No.: 11/509,320

(22) Filed: Aug. 24, 2006

(65) Prior Publication Data

US 2008/0048705 A1 Feb. 28, 2008

(51) Int. Cl.
*G01R 31/30* (2006.01)
*G06F 11/00* (2006.01)

(52) U.S. Cl. .................... 714/745; 714/798
(58) Field of Classification Search .......... None
See application file for complete search history.

(56) References Cited

U.S. PATENT DOCUMENTS

| | | | |
|---|---|---|---|
| 4,571,724 A * | 2/1986 | Belmondo et al. | 714/724 |
| 4,585,952 A | 4/1986 | Yamamoto et al. | |
| 5,416,402 A * | 5/1995 | Reher et al. | 340/636.15 |
| 5,757,203 A * | 5/1998 | Brown | 324/765 |

FOREIGN PATENT DOCUMENTS

| | | |
|---|---|---|
| JP | 56-69158 | 6/1981 |
| JP | 57-48845 | 3/1982 |
| JP | 57-53809 | 3/1982 |
| JP | 63-313945 | 12/1988 |

OTHER PUBLICATIONS

International Search Report dated Jul. 3, 2007, issued in International Application No. PCT/JP2007/060782, 3 pages.

* cited by examiner

*Primary Examiner*—Christine T Tu
(74) *Attorney, Agent, or Firm*—Osha • Liang LLP (57) ABSTRACT

There is provided a threshold voltage control apparatus that controls a threshold voltage for a level comparing section that detects a logic pattern of an input signal by comparing a level of the input signal with the threshold voltage. The apparatus includes: a plurality of timing generators that generate periodic signals each with different phase and each with approximately the same period; a shift register section having a plurality of flip-flops in a cascade arrangement that successively propagates data of the logic pattern through the plurality of flip-flops in response to a first of the periodic signals outputted by a first of the timing generators; a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

15 Claims, 9 Drawing Sheets

THRESHOLD VOLTAGE CONTROL APPARATUS, TEST APPARATUS, AND CIRCUIT DEVICE

BACKGROUND OF THE INVENTION

1. Field of the Invention

The present invention relates to a threshold voltage control apparatus, a test apparatus, and a circuit device. The present invention particularly relates to a threshold voltage control apparatus for adjusting timing of a threshold voltage at user's discretion to be supplied to a comparator.

2. Related Art

Generally, in case of testing a device under test (DUT) such as a semiconductor circuit, a method of inputting a predetermined signal into the DUT, measuring an output signal from the DUT, and determining PASS/FAIL of the DUT is known. For example, by inputting a predetermined logic pattern into the DUT and determining whether a logic pattern of the output from the DUT matches an expected pattern, it is possible to test whether the DUT operation is good or bad.

In case of doing such a test, an output of the DUT is inputted into a test apparatus. However, in case of this signal being attenuated through a path for transmitting the signal from the DUT to the test apparatus, a logic pattern to be inputted into the test apparatus and a logic pattern actually outputted from the DUT may be different.

In order to solve a problem like this, a test apparatus generally has a function in its input section to correct a waveform of an output signal from a DUT corresponding to signal attenuation in a transmission path. For example, a front end of an input section of a test apparatus includes a filter circuit to emphasize high frequency components, to correct for signal attenuation through the transmission line.

However, a typical test apparatus can emphasize high frequency based on a timing of an edge of the output signal from the DUT, it was not possible to correct an output waveform from the DUT on a timing at user's discretion. For example it was not possible in advance to correct for reflected waves generated in phase away from an edge in time wise. In addition, depending on a specification of the output section of the DUT or a specification of the transmission line of the test apparatus, parameters for the filter circuit for emphasizing high frequency components needed to be modified.

For this reason, there have been cases where it was not possible to test a DUT accurately.

Also, it may have been conceived that corresponding to signal attenuation, a threshold voltage to be applied to a comparator of a test apparatus may be controlled, even in such a condition, a reflected wave which was generated in phase away from an edge in time wise, the threshold voltage could not be controlled.

SUMMARY OF THE INVENTION

Therefore, it is an object of the present invention to provide a threshold voltage control apparatus, a test apparatus and a circuit device that can solve the foregoing problems. The above and other objects can be achieved by combinations described in the independent claims. The dependent claims define further advantageous and exemplary combinations of the present invention.

That is, according to a first aspect of the present invention, there is provided a threshold voltage control apparatus that controls a threshold voltage for a level comparing section that detects a logic pattern of an input signal by comparing a level of the input signal with the threshold voltage. The threshold voltage control apparatus includes: a plurality of timing generators that generate periodic signals each with different phase and each with approximately the same period; a shift register section having a plurality of flip-flops in a cascade arrangement that successively propagates data of the logic pattern through the plurality of flip-flops, in response to a first of the periodic signals outputted by a first of the timing generators; a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

The threshold voltage generating section may include: a plurality of computing circuits that are installed in one-to-one correspondence with the plurality of flip-flops and the plurality of registers and output a level of signal according to a multiplication result of multiplying a data value outputted by each of the corresponding flip-flops or the registers by each pre determined factor; and an output section that inputs the threshold voltage corresponding to an addition result of adding levels of signals outputted by each of the computing circuits, into the level comparing section.

The threshold voltage generating section may further include a plurality of code control circuits that are installed in one-to-one correspondence with the plurality of flip-flops and the plurality of registers and determine code of a data value outputted by each of the corresponding flip-flops or registers.

Distribution of edges of the periodic signals outputted by the plurality of timing generators except for the first of the timing generators may be denser near an edge of the periodic signal outputted by the first of the timing generators.

According to a second aspect of the present invention, there is provided a threshold voltage control apparatus that controls a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern. The threshold voltage control apparatus includes: a plurality of timing generators that generate periodic signals each with different phase and each with approximately the same period; a shift register section having a plurality of flip-flops in a cascade arrangement that successively propagates data of the logic pattern through the plurality of flip-flops, in response to a first of the periodic signals outputted by a first of the timing generators; a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

The shift register section inputs data series outputted by any of the flip-flops as the expected pattern into the logic comparing section, and may input data series outputted by the aforementioned flip-flops into the register of a first stage of the plurality of registers in a cascade arrangement.

According to a third aspect of the present invention, there is provided a threshold voltage control apparatus that controls a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern. The threshold voltage control apparatus includes: a plurality of timing generators that generate periodic signals each with different phase and each with approximately the same period; a post-cursor section having a plurality of flip-flops in a cascade arrangement that successively propagates data of the logic pattern through the plurality of flip-flops in response to a first of the periodic signals outputted by a first of the timing generators; a pre-cursor section having a plurality of flip-flops in a cascade arrangement that successively propagates data of the logic pattern through the plurality of flip-flops in response to the first of the periodic signals outputted by the first of the timing generators; a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

The pre-cursor section may input data outputted by a first stage of the flip-flops of the plurality of flip-flops into the register of a first stage of the plurality of registers in a cascade arrangement.

According to a fourth aspect of the present invention, there is provided a test apparatus that tests a device under test (DUT). The test apparatus includes: a pattern generating section that generates a test pattern to test the DUT and an expected pattern showing a pattern that should be outputted by the DUT according to the test pattern; a signal generating apparatus that generates a test signal to be inputted to the DUT, based on the test pattern; a level comparing section that detects a logic pattern of an output signal by comparing a level of the output signal of the DUT with a threshold voltage; a logic comparing section that compares the logic pattern with the expected pattern; and a threshold voltage control apparatus that controls the threshold voltage to be inputted into the level comparing section wherein the threshold voltage control apparatus has any of the aforementioned first through third aspects of the invention.

According to a fifth aspect of the present invention, there is provided a circuit device that inputs a threshold voltage for a level comparing section that detects a logic pattern of an input signal by comparing a level of the input signal with the threshold voltage. The circuit device includes: a substrate; and a threshold voltage control apparatus installed on the substrate, wherein the threshold voltage control apparatus includes: a plurality of timing generators that generate periodic signals each with different phase and each with approximately the same period; a shift register section having a plurality of flip-flops in a cascade arrangement that successively propagates data of the logic pattern through the plurality of flip-flops, in response to a first one of the periodic signals outputted by a first one of the timing generators; a plurality of registers that successively propagate data outputted by one of the flip-flops pre-determined, in one-to-one correspondence with the timing generators except for the first one of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

According to a sixth aspect of the present invention, there is provided a circuit device that inputs a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern. The circuit device includes: a substrate; and a threshold voltage control apparatus installed on the substrate, wherein the threshold voltage control apparatus includes: a plurality of timing generators that generate periodic signals each with different phase and each with approximately the same period; a shift register section having a plurality of flip-flops in a cascade arrangement that successively propagates data of the logic pattern through the plurality of flip-flops, in response to a first one of the periodic signals outputted by a first one of the timing generators; a plurality of registers that successively propagate data outputted by one of the flip-flops pre-selected, in one-to-one correspondence with the timing generators except for the first one of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

According to a seventh aspect of the present invention, there is provided a circuit device that inputs a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern. The circuit device includes: a substrate; and a threshold voltage control apparatus installed on the substrate, wherein the threshold voltage control apparatus includes: a plurality of timing generators that generate periodic signals each with different phase and each with approximately the same period; a post-cursor section having a plurality of flip-flops in a cascade arrangement that successively propagates data of the logic pattern through the plurality of flip-flops in response to a first of the periodic signals outputted by a first of the timing generators; a pre-cursor section having a plurality of flip-flops in a cascade arrangement that successively propagates data of the logic pattern through the plurality of flip-flops in response to the first of the periodic signals outputted by the first of the timing generators; a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
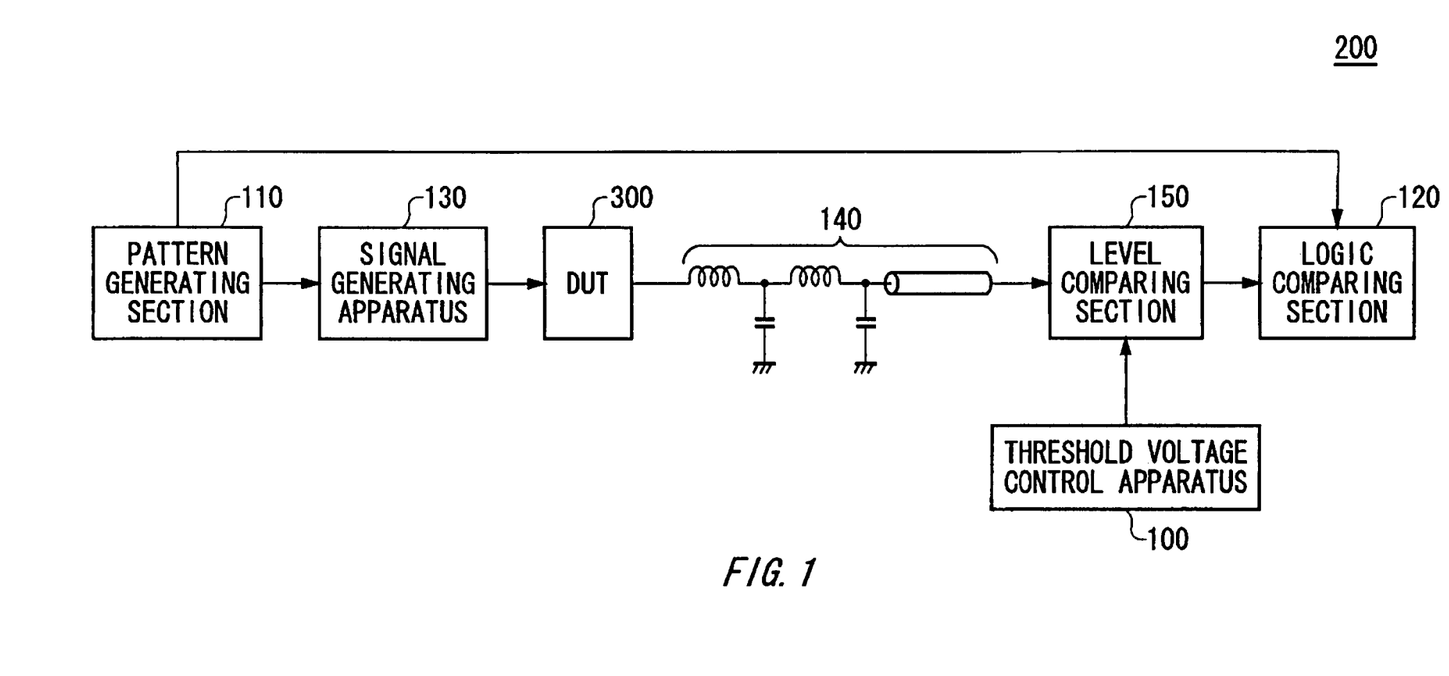
FIG. 1 shows an exemplary configuration of a test apparatus 200 according to an embodiment of the invention.

FIG. 1 is a view exemplary showing configuration of a test apparatus 200 according to an embodiment of the present invention. The test apparatus 200 tests a DUT 300 such as a semiconductor circuit. For example, the test apparatus 200 inputs into the DUT 300 a predetermined logic pattern signal and by comparing a logic pattern signal outputted from the DUT 300 with an expected pattern, determines PASS/FAIL of the DUT 300. The test apparatus 200 in the present example includes a pattern generating section 110, a signal generating apparatus 130, a transmission path 140, a level comparing section 150, a threshold voltage control apparatus 100, and a logic comparing section 120.

The pattern generating section 110 generates a test pattern to test the DUT 300. For example, the pattern generating section 110 generates a test pattern including a logic pattern (pattern data) that a test signal to be inputted into the DUT 300 should include.

The signal generating apparatus 130 generates a test signal to be inputted into the DUT 300 in response to the test pattern generated by the pattern generating section 110. For example, the signal generating apparatus 130 generates a test pattern showing a level based on the pattern data contained in the test pattern.

The transmission path 140 transmits the signal outputted from the DUT 300 in response to the test signal to the level comparing section 150. The transmission path 140, for example, may be wiring such as a cable. The transmission path 140 may be a cable having attenuation corresponding to the characteristics of the cable for a signal being transmitted and may be a cable having reflected waves.

The level comparing section 150 detects a logic pattern of an input signal by comparing a level of the input signal inputted by the transmission path 140 with a threshold voltage given. For example, the level comparing section 150 may output a binary logic pattern showing whether the input level is higher than the aforementioned threshold voltage.

The threshold voltage control apparatus 100 controls the threshold voltage given to the level comparing section 150. Detailed configuration of the threshold voltage control apparatus will be described below.

The logic comparing section 120 determines PASS/FAIL of the DUT 300 by comparing the logic pattern outputted by the level comparing section with the expected pattern. The pattern generating section 110 may generate an expected pattern showing the pattern outputted by the DUT in response to the test signal.

Figure 2:
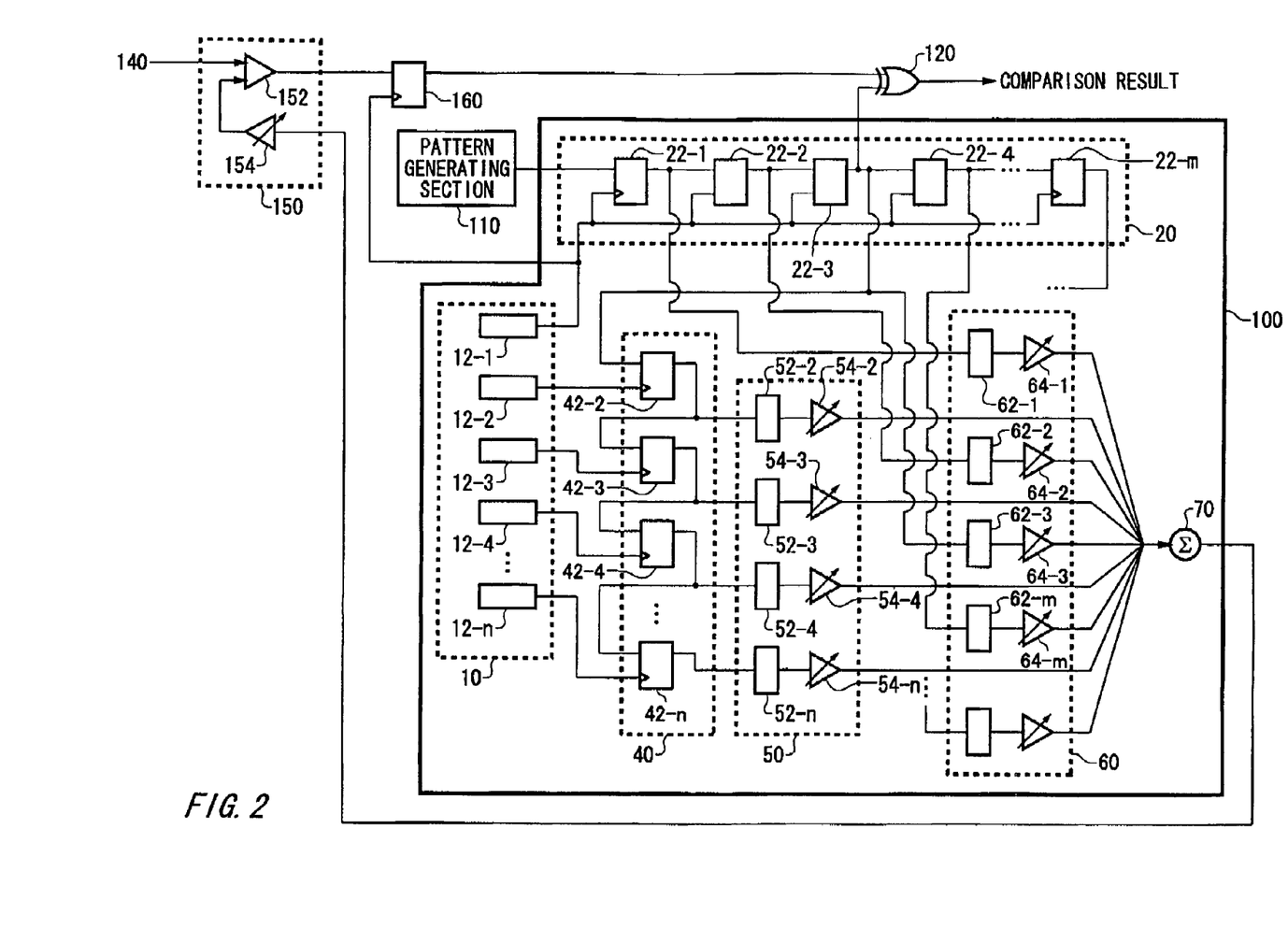
FIG. 2 shows an exemplary detailed configuration of a test apparatus 200.

FIG. 2 is a view exemplary showing a detailed configuration of a test apparatus 200. In the present example, the test apparatus 200 further includes a timing comparing section 160. In FIG. 2, the signal generating apparatus 130 that was explained in FIG. 1 is omitted.

A level comparing section 150 includes a comparator 152 and an amplifier 154. The comparator 152 compares a level of an input signal from a transmission path 140 with a threshold voltage given and outputs a comparison result. The amplifier 154 amplifies the threshold voltage given by a threshold control apparatus 100 at a predetermined amplification factor and input into the comparator 152.

The timing comparing section 160 captures and outputs the comparison result outputted by the level comparing section 150 in response to a given periodic signal. The timing comparing section 160 may be a flip-flop.

A logic comparing section 120 compares a logic pattern outputted by the timing comparing section 160 with an expected pattern given. The logic comparing section 120 may be an exclusive OR circuit.

The threshold voltage control apparatus 100 includes a timing generating section 10, a shift register section 20, a register section 40, and a threshold voltage generating section. In the present example, the threshold voltage generating section includes a first computing section 50, a second computing section 60, and an output section 70.

The timing generating section 10 includes a plurality of timing generators (12-1~12-n, hereinafter referred to as 12 in general) that generate, based on a given reference clock, a plurality of periodic signals each with differing phase from the reference clock. That is to say, the plurality of timing generators 12 generate a plurality of periodic signals each with approximately the same period and each with differing phase. Each of the timing generators 12 may be a PLL circuit.

Also, one of the timing generators 12 designated as a reference may be a PLL circuit and other timing generators may be delay circuits. In this case the timing generator designated as a reference generates a first periodic signal and each of the other timing generators 12 receives this branched first periodic signal and delays this first periodic signal, each with a different delay amount. The period of periodic signal outputted by each of the timing generators 12 may be approximately the same as data rate of the input signal. In the present example, the timing comparator 160 operates in response to the periodic signal outputted by a first timing generator 12-1.

The shift register section 20 includes a plurality of flip-flops (22-1~22-m, hereinafter referred to as 22 in general), and propagates successively each data of the expected pattern outputted by a pattern generation section 110. Each of the flip-flops 22 receives a first periodic signal outputted by the first timing generator 12-1 as an operation clock and propagates successively data of this expected pattern in response to this first periodic signal. Also, the shift register section 20 inputs data outputted by any of the flip-flop 22 as the expected pattern into the logic comparing section 120.

The second computing section 60 includes a plurality of code control circuits (62-1~62-*m*, hereinafter referred to as 62 in general) in one-to-one correspondence with the plurality of flip-flops 22 and a plurality of computing section (64-1~64-*m*, hereinafter referred to as 64). Each of the code control circuits 62 determines code for the data value outputted by the corresponding flip-flops 22.

That is to say, each of the code control circuits 62 selects either positive or negative code of the data value outputted by the corresponding flip-flop 22 and output the code. The code selected by the code control circuits 62 may be preset by a user. Also, during operation of the threshold voltage control apparatus 100, the code selected by the control circuit 62 may be fixed, also the code selected during operation of the threshold voltage control apparatus 100 may be alterable.

Each of the computing circuits 64 receives via the corresponding code control circuit 62 the data value outputted by the corresponding flip-flop 22. Each of the computing circuits 64 outputs a level of signal corresponding to a result of multiplication of multiplying the data value received by a preset correlation factor. Each of the computing circuits 64 may be an amplifying circuit having a gain corresponding to this correlation factor. Also, during operation of the threshold voltage control apparatus 100, the correlation factor of the computing circuit 64 may be fixed and during operation of the threshold voltage control apparatus 100 the correlation factor may be alterable.

The output section 70 inputs into the level comparing section 150, the threshold voltage with a waveform of a signal outputted by each of the computing circuits 64 added. By a configuration like this one, it is possible to control the threshold voltage for the input signal with an edge of the first periodic signal as a reference and based on the logic pattern that the input signal should have. That is to say, it is possible to control the threshold voltage with a timing synchronized with data transition timing of the input signal as a reference.

The register section 40 includes a plurality of registers (42-2~42-*n*, hereinafter referred to as 42 in general) installed correspondingly to the timing generators (12-1~12-*n*) except for the first timing generator 12-1. Each of the registers 42 is installed in an cascade arrangement. That is to say, output data from each of the registers 42 are inputted into the next stage register 42. Each of the registers 42 captures input data in response to the periodic signal outputted by the corresponding timing generator 12 and outputs the data. In the present example, data outputted by a pre-selected flip-flop are inputted into a first stage register 42-2 and successively propagated in response to the periodic signal outputted by the corresponding timing generator 12. The threshold voltage control apparatus 100 may include a selecting section selecting any of the flip-flops 22. Also, the pre-selected flip-flop 22 may be hardwired to the first stage register 42-2. The first stage register 42-2 may receive an expected pattern inputted into the logic comparator 120 by branching. Thus, the same flip-flop 22 may output data inputted into the logic comparing section 120 and output data inputted into the first stage of the register 42-2.

A first computing section 50 includes a plurality of code control circuits (52-1~52-*m*, hereinafter referred to as 52 in general) installed in one-to-one correspondence with the plurality of register 42 and a plurality of computing circuits (54-1~54-*m*, hereinafter referred to as 54 in general). Each of the code control circuits 52 determines code for a data value outputted by the corresponding register 42. That is to say, each of the code control circuits 52 selects either positive or negative code for a data value outputted by the corresponding register 42 and outputs the data. The code selected by the code control circuit 52 may be preset by a user. Also during operation of the threshold voltage control apparatus 100, the code selected by the code control circuit 52 may be fixed and during operation of the threshold voltage control apparatus the code selected may be alterable.

Each of the computing circuits 54 receives via the corresponding code control circuit 52 a data value outputted by the corresponding flip-flop 42. Each of the computing circuits 54 outputs a level of signal corresponding to a result of multiplication of multiplying the received data value by a preset correlation factor. Each of the computing circuits 54 may be an amplifying circuit having a gain corresponding to this correlation factor. Also, during operation of the threshold voltage control apparatus 100, the correlation factor of the computing circuit 54 may be fixed and during operation of the threshold voltage control apparatus 100, the correlation factor may be alterable.

The output section 70 adds waveforms of signals outputted by each of the computing circuits 54 and outputs. That is to say, the output section 70 outputs the threshold voltage by adding waveforms of signals outputted by the plurality of computing circuits 54 and the plurality of computing circuits 64.

By a configuration like this one, it is possible to control the threshold voltage for an input signal with a reference which has different timing from the first periodic signal Phase for the periodic signal outputted by each of the timing generators 12 in relation to the first periodic signal may be set at user's discretion. Thus, it is possible to correct a waveform of an input signal with a timing reference at user's discretion. For example, for phase (an edge timing of other periodic signals besides the first one) separate in time wise from an edge of an input signal (an edge timing of the first periodic signal), it is possible to generate a waveform according to the aforementioned edge of other periodic signals. Thus for example in case of a reflected wave occurring in the transmission path 140, it is possible to generate a threshold voltage negating this reflected wave. Thus based on an equivalent signal with a signal at an output terminal of the DUT 300, the DUT 300 can be tested accurately.

Figure 3:
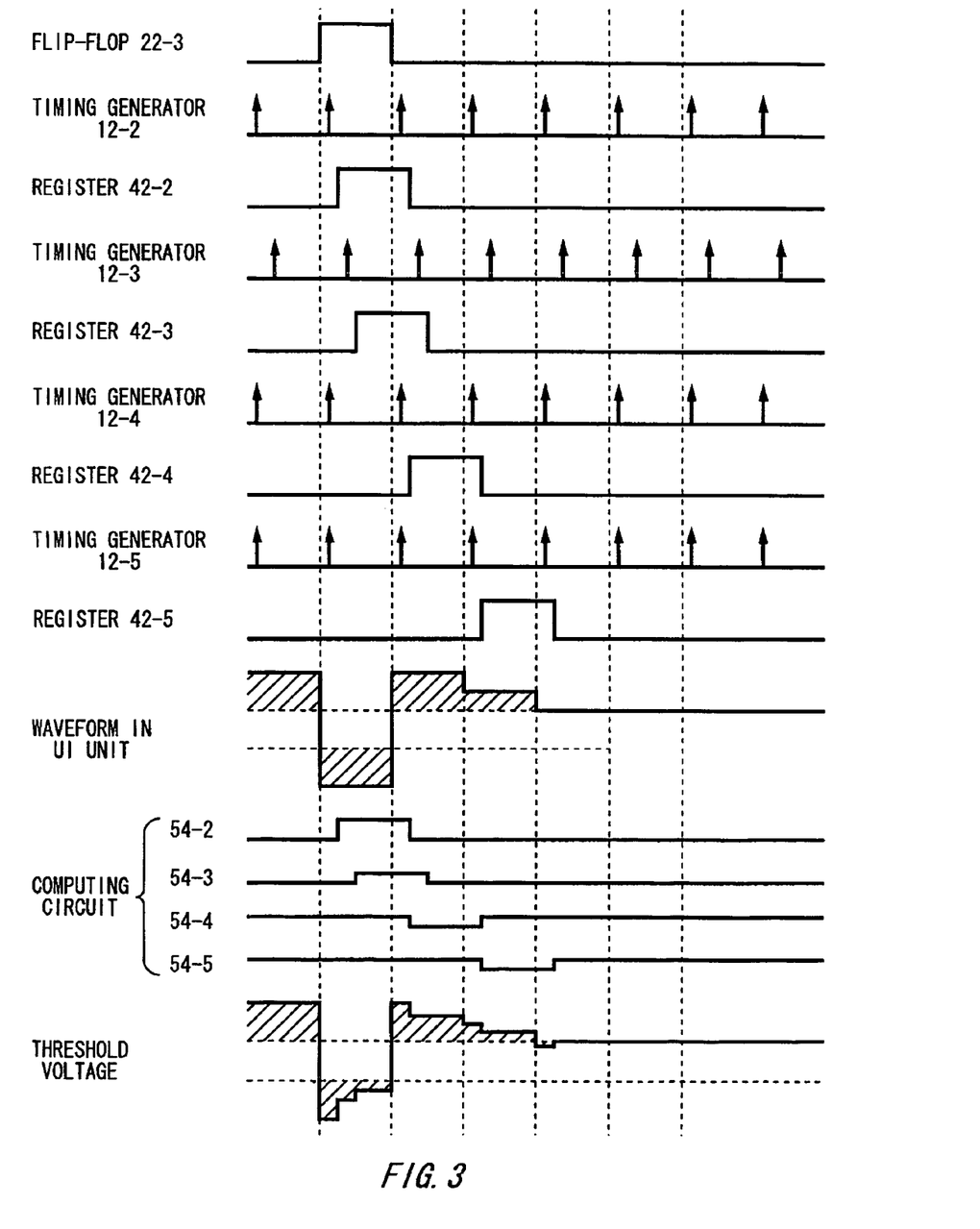
FIG. 3 is a timing chart showing an exemplary operation of a threshold voltage control apparatus 100

FIG. 3 is a timing chart showing an exemplary operation of a threshold voltage control apparatus 100. In FIG. 3, a threshold voltage control by a first computing section 50 is explained mainly. In the present example, a case of having 5 timing generators is explained. Also, in the present example, data outputted by a flip-flop 22-3 is inputted into a first stage register 42-2.

The flip-flop 22-3 successively propagates a data value outputted by a pattern generation section 110 in response to a first periodic signal. As shown in FIG. 3, in case of the flip-flop 22-3 outputting a data value 1, the register 42-2 captures the data value 1 in response to a second periodic signal outputted by a corresponding timing generator 12-2 and outputs. The subsequent stage register 42 similarly captures data outputted by the front stage register 42 in response to the periodic signal outputted by the corresponding timing generator 12 and outputs.

Each of computing circuits 54, as shown in FIG. 3, outputs a signal corresponding to a data value outputted by the corresponding register 42. As described above, the computing circuits 54 outputs a level of signal for the data value outputted by the corresponding register 42 multiplied by a pre determined correlation factor. Also, each of code control circuits 52 determines code for the signal outputted by the corresponding computing circuit 54.

An output section 70 adds waveforms of signals outputted by each of the computing circuits and controls a waveform of a threshold voltage. At this time a waveform in UI unit generated by a second computing section 60 is further added. The waveform in UI unit is generated using general technology and its explanation is omitted.

In FIG. 3, the area corrected by the first computing unit 50 and the second computing unit 60 is shown in diagonal lines. As shown in FIG. 3, because it is possible to control a waveform of the threshold voltage based on a plurality of periodic signals with different phases, it is possible to control with a high degree of freedom. FIG. 3 is an example showing a setting of the threshold voltage control apparatus 100 for correctly judging an output signal of a DUT attenuated by a transmission path. By changing the setting of the threshold voltage control apparatus, it is possible to do the threshold voltage control simulating a longer transmission path than the actual transmission path.

As described above, in the present example, by using the threshold voltage control apparatus 100, based on a logic pattern included in an input signal, the threshold voltage control using 1 UI unit of the input signal as a reference can be done, in addition it is possible to do the threshold voltage control with a reference having a timing at user's discretion in relation to the input signal. Thus the threshold voltage can be accurately corrected, and the DUT 300 can be tested accurately.

Figure 4A:
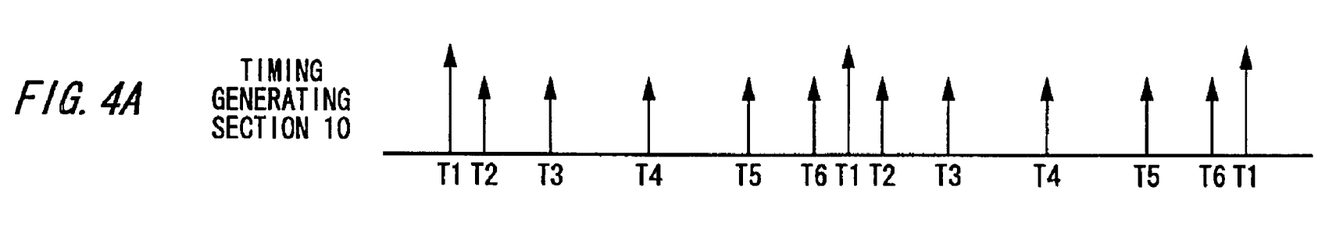
FIG. 4A is a timing chart showing an exemplary operation of a threshold voltage control apparatus 100

FIG. 4 is a timing chart showing yet another exemplary edge timing of a plurality of periodic signals. A timing generating section 10, as shown in FIG. 4A, may output each periodic signal such that distribution of edge timings of the periodic signals outputted by a plurality of timing generators 12 except for a first timing generator 12-1 will become denser as it approaches an edge timing of a first periodic signals outputted by the first timing generator 12-1. In this case, near a signal edge of an input signal, a threshold voltage can be controlled more accurately. That is to say, near the signal edge of the input signal, level comparison can be done more accurately.

Figure 4B:
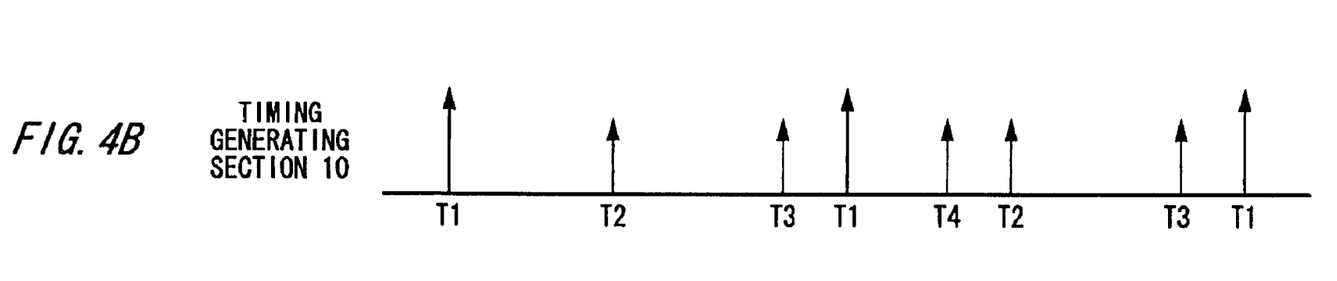
FIG. 4B shows another exemplary edge timing of a plurality of periodic signals.

Also, the timing generating section 10, as shown in FIG. 4B, may enlarge phase difference between the first periodic signal and the periodic signal outputted by any of the timing generators 12 by more than 1 UI (period of the first periodic signal). In this case, for example it is possible to generate a threshold voltage to negate a reflected wave occurring in phase more than 1 UI separated in time from an input signal pulse.

Figure 5:
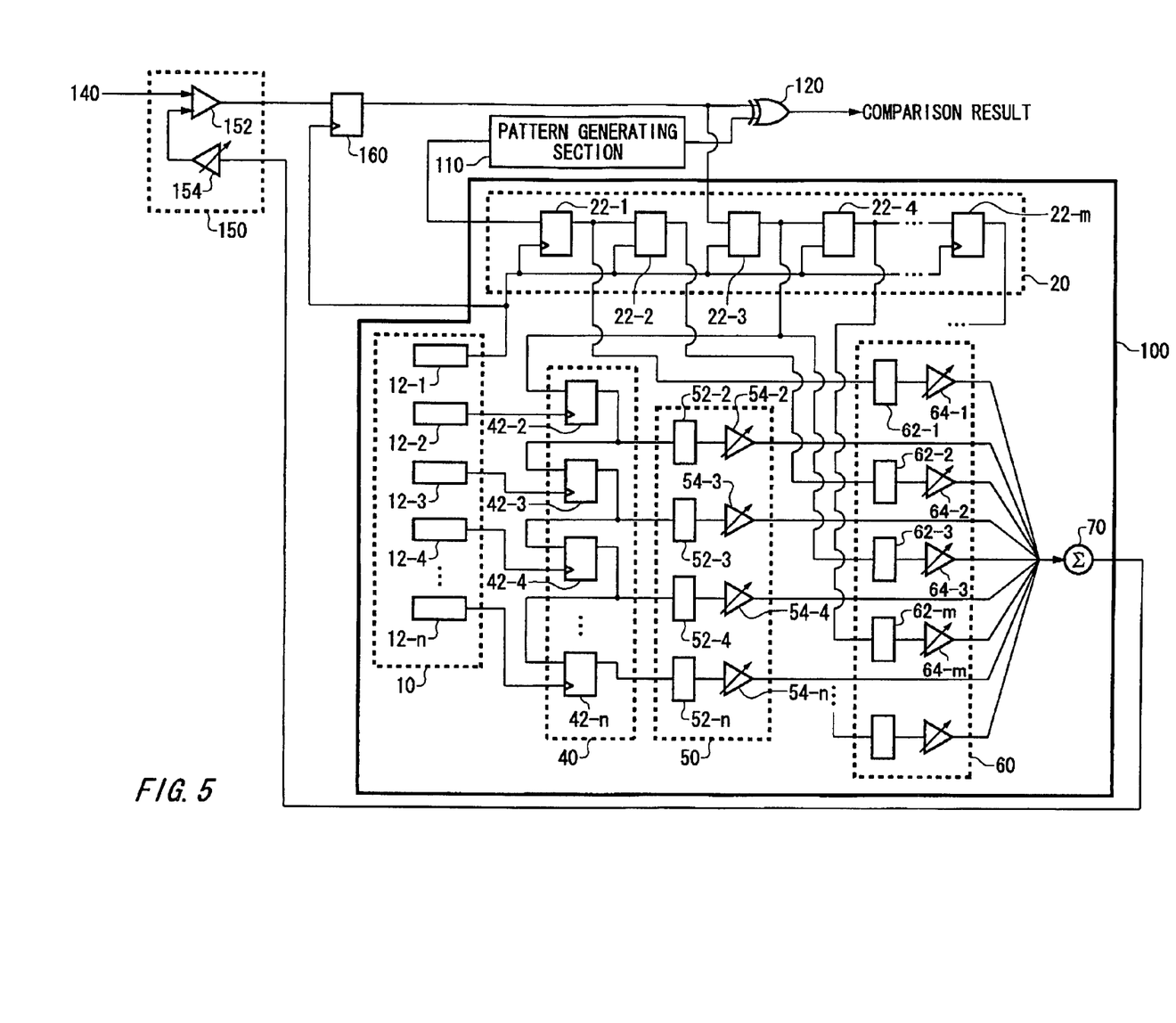
FIG. 5 shows another exemplary configuration of a threshold voltage control apparatus 100.

FIG. 5 shows another exemplary configuration of a threshold voltage control apparatus 100. Also, in the present example, a logic comparing section 120 receives an expected pattern from a pattern generating section 110 without going through a shift register section 20.

Also, a plurality of flip-flops 22 in the shift register section 20, are separated into a post-cursor section and a pre-cursor section. In the present example, the post-cursor section includes the flip-flops (22-1~22-2) and the pre-cursor section includes the flip-flops (22-3~22-m). In addition, a second computing section 60 includes a plurality of code control circuits (62-1~62-m, hereinafter referred to as 62) and a plurality of computing sections (64-1~64-m, hereinafter referred to as 64) that are in one-to-one correspondence with the plurality of flip-flops 22 in the post-cursor section and the pre-cursor section. That is to say, connection arrangement of the second computing section 60 is similar to the threshold voltage control apparatus 100 as shown in FIG. 2.

The post-cursor section successively transmits through the plurality of flip-flops 22 an expected pattern of data outputted by the pattern generating section 110 in response to a first periodic signal outputted by a first timing generator 12-1

Also, the pre-cursor section successively transmits through the plurality of flip-flops 22, a logic pattern of data of an input signal in response to a first periodic signal outputted by a first timing generator 12-1. Also the pre-cursor section inputs data outputted by any of the flip-flops 22 by branching to a first stage of a register 42-2. In the present example, the pre-cursor section inputs data outputted by a first stage of the flip-flop 22-3 into the first stage of the register 42-2.

Other configuration elements have the same functionality as the configuration elements with the same reference numerals as in FIG. 2.

Because the threshold voltage control apparatus 100 as shown in FIG. 2 controls the threshold voltage based on an expected pattern, in case a logic pattern of an input signal does not match its expected pattern, it may not be possible to generate a threshold voltage according to the logic pattern of the input signal. In response, in the present example the threshold voltage control apparatus 100 controls the threshold voltage based on the logic pattern of the input signal, a level of the input signal can be compared more accurately.

Also, the threshold voltage given to a level comparator 150 should preferably be controlled according to a logic value detected by a timing comparator 160. It is sometime possible that control of the threshold voltage may be delayed due to operation speed and transmission delay etc. of the threshold voltage control apparatus 100.

In response, in the present example, according to the threshold voltage control apparatus 100, by installing the post-cursor section, delay in control of this threshold voltage can be corrected. That is to say, for the post-cursor section to have a number of stages of flip-flops 22 corresponding to the delay amount of control of this threshold voltage, it is possible to compensate for the delay in control of the aforementioned threshold voltage. Also, the pattern generating section 110 may input into the post-cursor section, an expected pattern preceding the expected pattern given to the logic comparing section 120 in response to a delay amount of control for the aforementioned threshold voltage.

Figure 6:
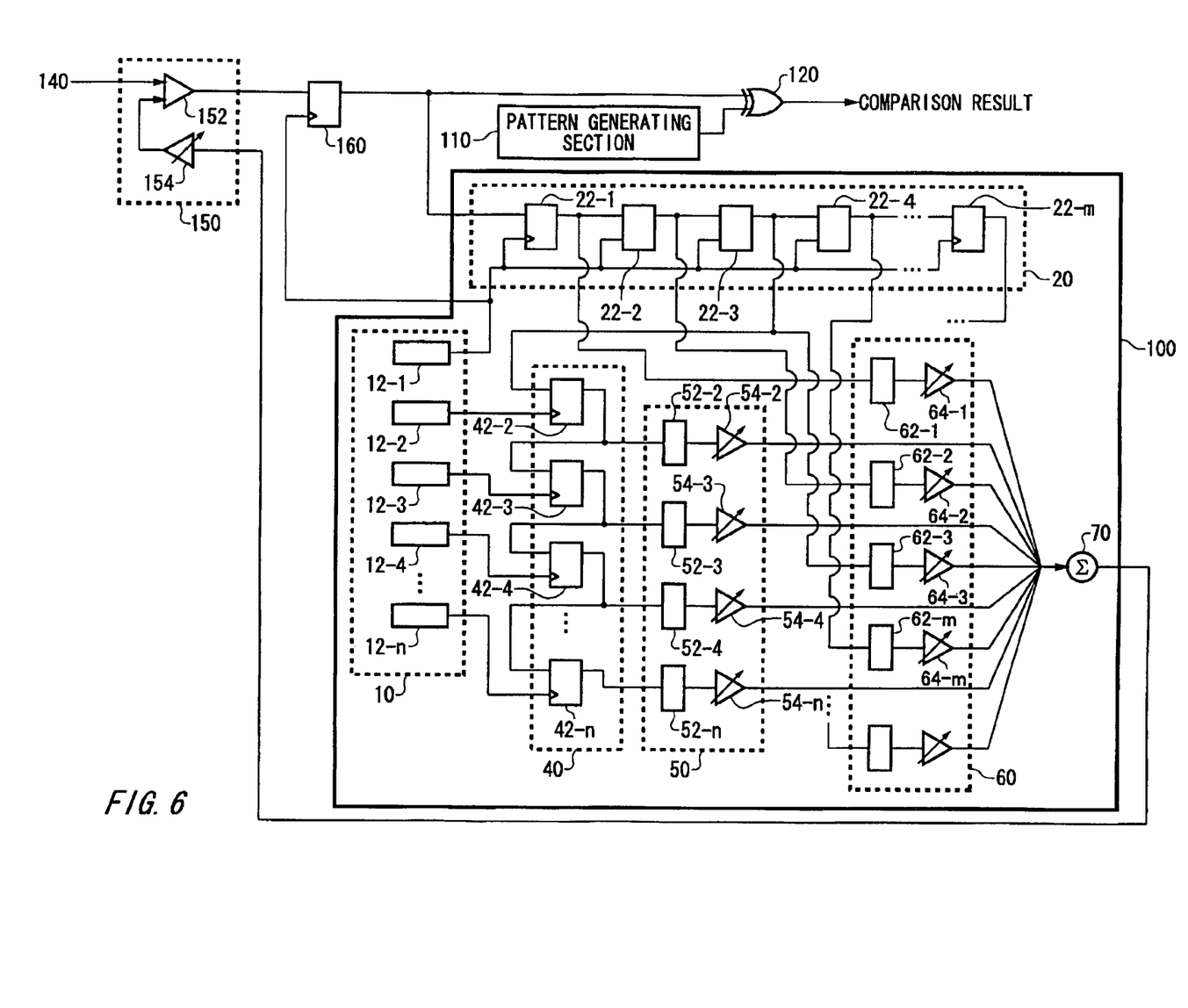
FIG. 6 shows yet another exemplary configuration of a threshold voltage control apparatus 100.

FIG. 6 shows yet another exemplary configuration of a threshold voltage control apparatus 100. In the present example, a logic comparing section 120 receives an expected pattern from a pattern generating section 110 without going through a shift register section 20.

Also, the shift register section 20 successively propagates data of a logic pattern of an input pattern, outputted by a timing comparing section 160 through a plurality of flip-flops 22 in response to a first periodic signal. Other configuration elements have similar functionality as configuration elements with the same reference numerals in FIG. 2.

In the present example, the threshold voltage control apparatus 100 controls a threshold voltage based on a logic pattern of an input signal, the threshold voltage can be controlled accurately. In the present example, the threshold voltage control apparatus 100 is especially effective when the above described control delay of the threshold voltage is negligibly small.

Figure 7:
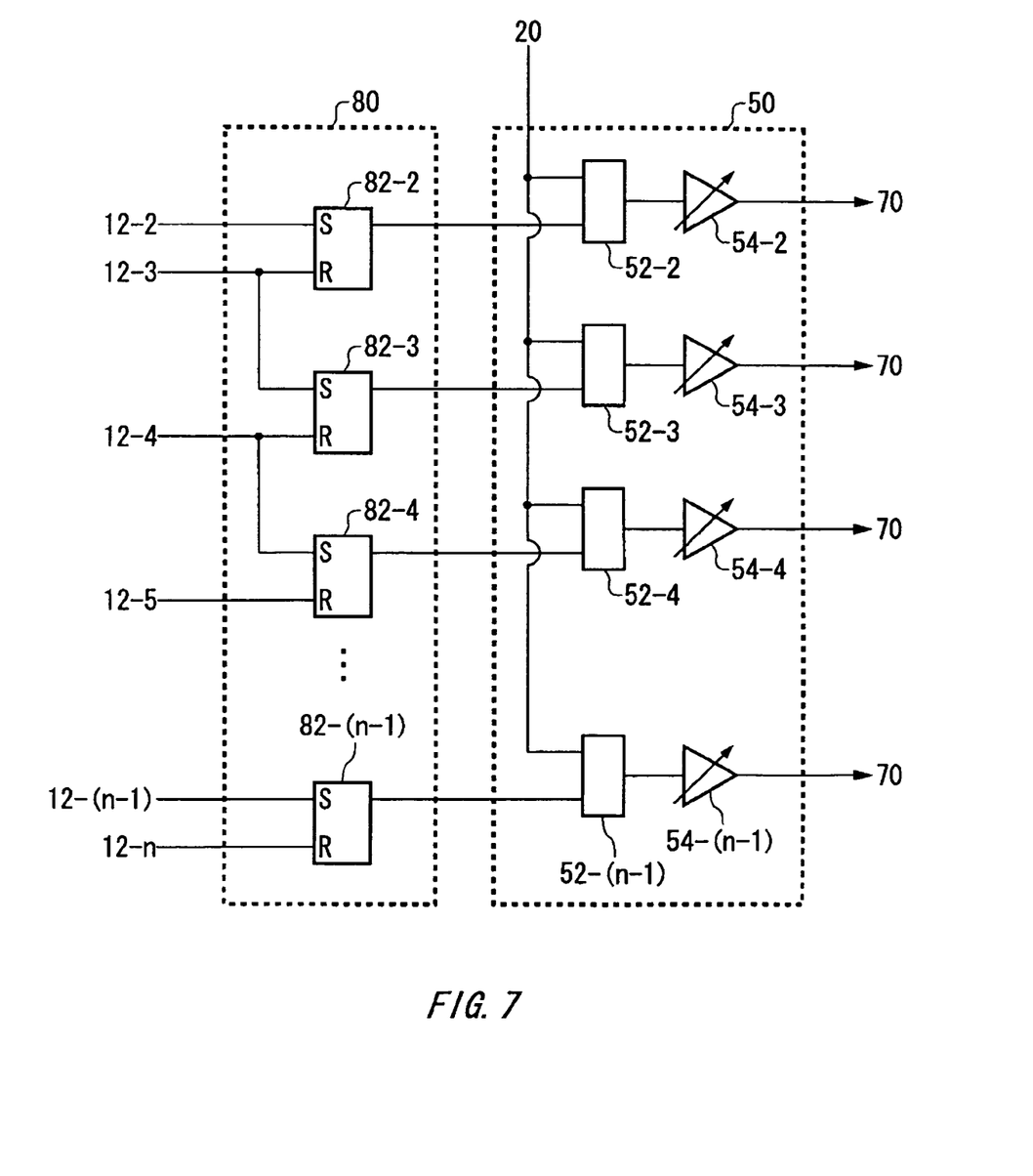
FIG. 7 shows yet another exemplary configuration of a threshold voltage control apparatus 100.

FIG. 7 shows yet another exemplary configuration of a threshold voltage control apparatus 100. In the present example, the threshold voltage control apparatus 100 differs from the threshold voltage control apparatus configurations shown in any of FIG. 2, FIG. 5, or FIG. 6, by having a set reset latch section 80 instead of a register section 40. Other configuration elements have similar or the same functionality and configuration as configuration elements with the same reference numerals in FIG. 2, FIG. 5, or FIG. 6.

The set reset latch section 80 includes a plurality of set reset latches (82-2~82-(n-1), hereinafter referred to as 82) installed corresponding to a first timing generator 12-1 and timing generators (12-1~12-(n-1)) other than a last stage timing generator 12-n. Each of the set reset latches 82 receives each periodic signal from the corresponding timing generator 12 and a next stage timing generator 12 which is next to the aforementioned timing generator 12. Here the next stage timing generator 12 outputs periodic signal with phase delay from the periodic signal outputted by the aforementioned timing generator 12 and it may be the timing generator 12 that outputs periodic signal having nearest phase with the phase of periodic signal outputted by the aforementioned timing generator 12.

Each of the set reset latches 82 outputs signal showing logic value 1 during the period defined by an edge of a periodic signal received from the corresponding timing generator 12 and an edge of a periodic signal received from the next stage timing generator 12.

Also, a tap control section 30 inputs data value outputted by a selected flip-flop 22 into each of code control circuits 52. Each of the code control circuits 52 decides and outputs code for the received data value when corresponding set reset latch 82 outputs the logic value 1.

In the present example, the threshold voltage control apparatus 100 can control a threshold voltage with timing at user's discretion corresponding to an edge of each of periodic signals, and control a waveform of the threshold voltage with pulse width at user's discretion corresponding to phase difference of each periodic signal. For example, by making phase difference of periodic signals outputted by any 2 of the timing generators 12 small, very accurate correction of a waveform can be done.

Figure 8:
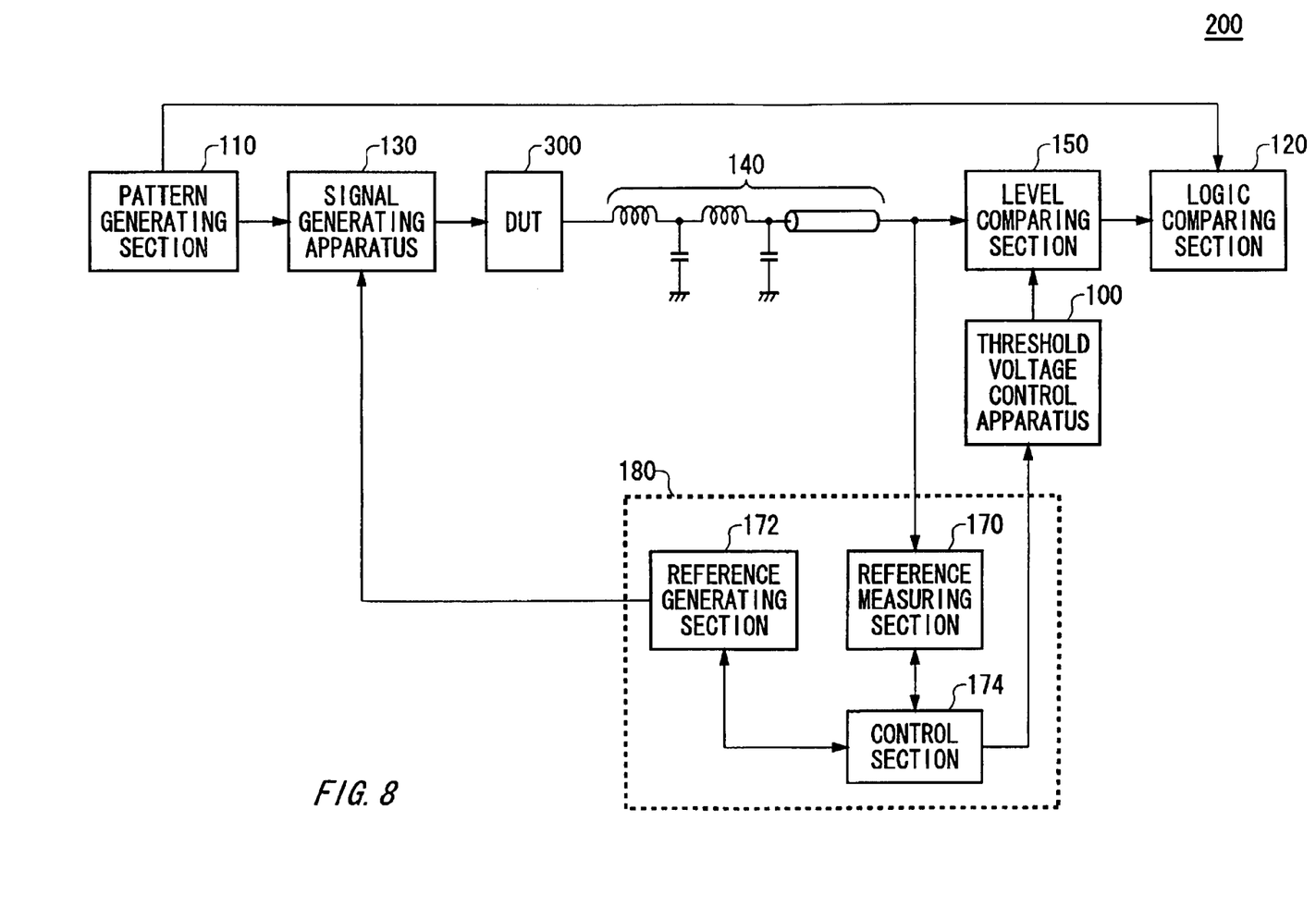
FIG. 8 shows another exemplary configuration of a test apparatus 200.

FIG. 8 shows another exemplary configuration of a test apparatus 200. In the present example, the test apparatus 200, in addition to the test apparatus 200 configuration explained in relation to FIG. 1, includes a calibration section 180. Other configuration elements have similar functionality and configuration as configuration elements with the same reference numerals in FIG. 1.

The calibration section 180 calibrates a threshold voltage control apparatus 100 before testing a DUT 300. The calibration section 180 includes a reference generating section 172, a reference measuring section 170 and control section 174.

The reference generating section 172 causes a signal generating apparatus 130 to output a reference signal of a pre determined waveform. The reference generating section 172 may cause the DUT 300 to output the aforementioned reference signal in order to output a pre determined logic pattern signal. The reference generating section 172 may cause the pattern generating section 110 to output pre determined pattern data.

The reference measuring section 170 measures a waveform of an input signal propagated to an input terminal of a level comparing section. The control section 174 does setup for a second computing section 60 and a first computing section 50 based on a waveform of an input signal measured by the reference measuring section 170. For example the control section 174 does setup code for each of code control circuits 52 and code control circuits 62 and does setup weighting factor for each of computing circuits 54 and computing circuits 64. Also the control circuit may set phase for periodic signal outputted by each of timing generators 12.

Figure 9:
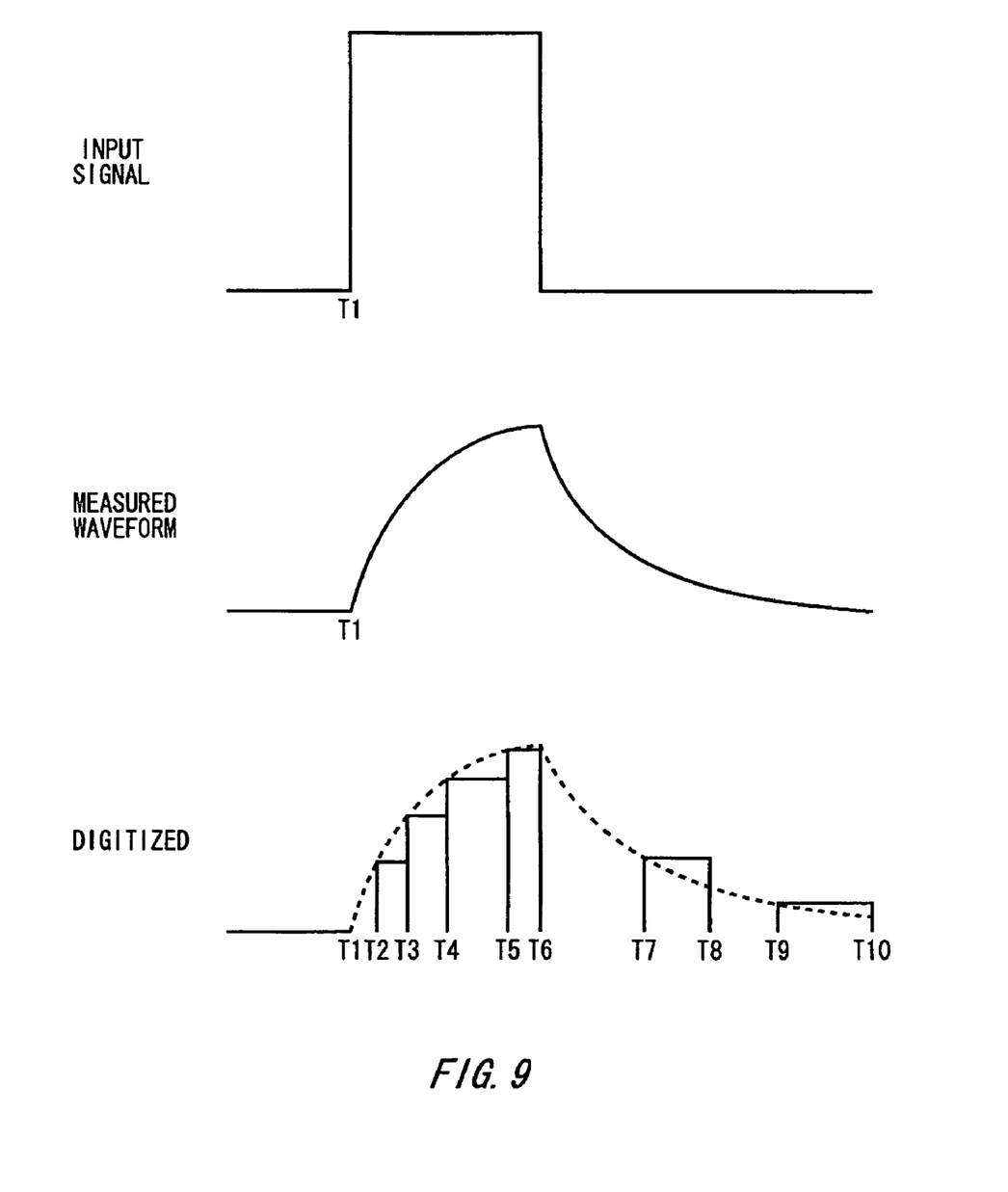
FIG. 9 shows an exemplary operation of a calibration section 180

FIG. 9 shows an exemplary operation of a calibration section 180. As described above, a reference generating section 172 causes a DUT 300 to output a predetermined input signal. A reference measuring section 170 measures a waveform of a signal transmitted to an input terminal of the DUT 300.

A control section 174 digitizes the measured waveform measured by the reference measuring section 170 as shown in FIG. 9. Also the control section 174 detects attenuation of an input signal in a transmission path based on the digitized measured waveform and according to detection result calibrates a threshold voltage control apparatus 100.

For example, the control section 174 approximates the aforementioned measured waveform using a plurality of pulses. In addition, the control section 174 may control phase of a periodic signal outputted by each of timing generators 12 based on each pulse width and pulse phase. Also, the control section 174 may control weighting factor for each of computing circuits 54 and computing circuits 64 based on a level of each of rectangular waves. Also, the control section 174 compares the waveform of the input signal that should be outputted by the DUT 300 with the digitized measured waveform and may judge whether to impose or reduce component of each of the rectangular waves of the measured waveform to the threshold voltage. The control section 174 may control code for each of code control circuits 52 and code control circuits 62 based on the aforementioned judging result.

Also, the threshold voltage control apparatus 100 explained in FIG. 2, FIG. 5 or FIG. 6 may be a circuit device fabricated on a semiconductor device. For example the threshold voltage control apparatus 100 may be fabricated on a semiconductor chip.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to provide a threshold voltage control apparatus to control a threshold voltage with phase at user's discretion as a reference. Also, it is possible to provide a test apparatus to test a device under test accurately.

The invention claimed is:

1. A threshold voltage control apparatus that controls a threshold voltage for a level comparing section that detects a logic pattern of an input signal by comparing a level of the input signal with the threshold voltage, comprising:

a plurality of timing generators that generate periodic signals each with different phase and each with approximately the same period;

a shift register section having a plurality of flip-flops in a cascade arrangement that successively propagates data of the logic pattern through the plurality of flip-flops, in response to a first of the periodic signals outputted by a first of the timing generators;

a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and a threshold voltage generating section that generates the threshold voltage given to the level comparing section, based on data value outputted by the plurality of registers and data value outputted by the plurality of flip-flops.

2. The threshold voltage control apparatus as claimed in claim 1, wherein the threshold voltage generating section comprising:
- a plurality of computing circuits that are installed in one-to-one correspondence with the plurality of flip-flops and the plurality of registers and output a level of signal according to a multiplication result of multiplying a data value outputted by each of the corresponding flip-flops or the registers by each predetermined factor; and
- an output section that inputs the threshold voltage corresponding to an addition result of adding levels of signals outputted by each of the computing circuits, into the level comparing section.

3. The threshold voltage control apparatus as claimed in claim 2, wherein the threshold voltage generating section further comprising a plurality of code control circuits that are installed in one-to-one correspondence with the plurality of flip-flops and registers and determine code of a data value outputted by each of the corresponding flip-flops or registers.

4. The threshold voltage control apparatus as claimed in claim 1, wherein distribution of edges of the periodic signals outputted by the plurality of timing generators except for the first of the timing generators is more dense near an edge of the periodic signal outputted by the first of the timing generators.

5. The threshold voltage control apparatus as claimed in claim 1, wherein phase difference between the first of the periodic signals and the periodic signal outputted by any of the timing generators except for the first of the timing generators is greater than one period of the first of the periodic signals.

6. A test apparatus that tests a device under test (DUT) comprising:
- a pattern generating section that generates a test pattern to test the DUT and
- an expected pattern showing a pattern that should be outputted by the DUT according to the test pattern;
- a signal generating apparatus that generates a test signal to be inputted to the DUT, based on the test pattern;
- a level comparing section that detects a logic pattern of an output signal by comparing a level of the output signal of the DUT with a threshold voltage;
- a logic comparing section that compares the logic pattern with the expected pattern; and
- a threshold voltage control apparatus that controls the threshold voltage to be inputted into the level comparing section, wherein the threshold voltage control apparatus is the threshold voltage control apparatus as claimed in claim 1.

7. A threshold voltage control apparatus that controls a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern, comprising:
- a plurality of timing generators that generate periodic signals each with different phase and each with approximately the same period;
- a shift register section having a plurality of flip-flops in a cascade arrangement that successively propagates data of the logic pattern through the plurality of flip-flops, in response to a first of the periodic signals outputted by a first of the timing generators;
- a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and
- a threshold voltage generating section that generates the threshold voltage given to the level comparing section, based on data value outputted by the plurality of registers and data value outputted by the plurality of flip-flops.

8. The threshold voltage control apparatus as claimed in claim 7, wherein the shift register section inputs data series outputted by any of the flip-flops as the expected pattern into the logic comparing section, and inputs data series outputted by the aforementioned flip-flops into the register of a first stage of the plurality of registers in a cascade arrangement.

9. A test apparatus that tests a device under test (DUT) comprising:
- a pattern generating section that generates a test pattern to test the DUT and
- an expected pattern showing a pattern that should be outputted by the DUT according to the test pattern;
- a signal generating apparatus that generates a test signal to be inputted to the DUT, based on the test pattern;
- a level comparing section that detects a logic pattern of an output signal by comparing a level of the output signal of the DUT with a threshold voltage;
- a logic comparing section that compares the logic pattern with the expected pattern; and
- a threshold voltage control apparatus that controls the threshold voltage to be inputted into the level comparing section, wherein the threshold voltage control apparatus is the threshold voltage control apparatus as claimed in claim 7.

10. A threshold voltage control apparatus that controls a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern, comprising:
- a plurality of timing generators that generate periodic signals each with different phase and each with approximately the same period;
- a post-cursor section having a plurality of flip-flops in a cascade arrangement that successively propagates data of the logic pattern through the plurality of flip-flops in response to a first of the periodic signals outputted by a first of the timing generators;
- a pre-cursor section having a plurality of flip-flops in a cascade arrangement that successively propagates data of the logic pattern through the plurality of flip-flops in response to the first of the periodic signals outputted by the first of the timing generators;
- a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and
- a threshold voltage generating section that generates the threshold voltage given to the level comparing section, based on data value outputted by the plurality of registers and data value outputted by the plurality of flip-flops.

11. The threshold voltage control apparatus as claimed in claim 10, wherein the pre-cursor section inputs data outputted by a first stage of the flip-flops of the plurality of flip-flops into the register of a first stage of the plurality of registers in a cascade arrangement.

12. A test apparatus that tests a device under test (DUT) comprising:
a pattern generating section that generates a test pattern to test the DUT and
an expected pattern showing a pattern that should be outputted by the DUT according to the test pattern;
a signal generating apparatus that generates a test signal to be inputted to the DUT, based on the test pattern;
a level comparing section that detects a logic pattern of an output signal by comparing a level of the output signal of the DUT with a threshold voltage;
a logic comparing section that compares the logic pattern with the expected pattern; and
a threshold voltage control apparatus that controls the threshold voltage to be inputted into the level comparing section, wherein the threshold voltage control apparatus is the threshold voltage control apparatus as claimed in claim 10.

13. A circuit device that inputs a threshold voltage for a level comparing section that detects a logic pattern of an input signal by comparing a level of the input signal with the threshold voltage, comprising:
a substrate; and
a threshold voltage control apparatus installed on the substrate, wherein the threshold voltage control apparatus comprising:
a plurality of timing generators that generate periodic signals each with different phase and each with approximately the same period;
a shift register section having a plurality of flip-flops in a cascade arrangement that successively propagates data of the logic pattern through the plurality of flip-flops, in response to a first one of the periodic signals outputted by a first one of the timing generators;
a plurality of registers that successively propagate data outputted by one of the flip-flops pre-determined, in one-to-one correspondence with the timing generators except for the first one of the timing generators and installed in a cascade arrangement, in response to the periodic signals outputted by the corresponding timing generators; and
a threshold voltage generating section that generates the threshold voltage given to the level comparing section, based on data value outputted by the plurality of registers and data value outputted by the plurality of flip-flops.

14. A circuit device that inputs a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern, comprising:
a substrate; and
a threshold voltage control apparatus installed on the substrate, wherein the threshold voltage control apparatus comprising:
a plurality of timing generators that generate periodic signals each with different phase and each with approximately the same period;
a shift register section having a plurality of flip-flops in a cascade arrangement that successively propagates data of the logic pattern through the plurality of flip-flops, in response to a first one of the periodic signals outputted by a first one of the timing generators;
a plurality of registers that successively propagate data outputted by one of the flip-flops pre-selected, in one-to-one correspondence with the timing generators except for the first one of the timing generators and installed in a cascade arrangement, in response to the periodic signals outputted by the corresponding timing generators; and
a threshold voltage generating section that generates the threshold voltage given to the level comparing section, based on data value outputted by the plurality of registers and data value outputted by the plurality of flip-flops.

15. A circuit device that inputs a threshold voltage for a circuit including a level comparing section that detects a logic pattern of an input signal by comparing a level of the input signal with the threshold voltage, a pattern generating section that generates an expected pattern of the logic pattern, and a logic comparing section that compares the logic pattern with the expected pattern, comprising:
a substrate; and
a threshold voltage control apparatus installed on the substrate, wherein the threshold voltage control apparatus including:
a plurality of timing generators that generate periodic signals each with different phase and each with approximately the same period;
a post-cursor section having a plurality of flip-flops in a cascade arrangement that successively propagates data of the logic pattern through the plurality of flip-flops in response to a first of the periodic signals outputted by a first of the timing generators;
a pre-cursor section having a plurality of flip-flops in a cascade arrangement that successively propagates data of the logic pattern through the plurality of flip-flops in response to the first of the periodic signals outputted by the first of the timing generators;
a plurality of registers that successively propagate data outputted by one of the flip-flops pre-selected, in one-to-one correspondence with the timing generators except for the first of the timing generators and installed in a cascade arrangement, in response to the periodic signals outputted by the corresponding timing generators; and
a threshold voltage generating section that generates the threshold voltage given to the level comparing section, based on data value outputted by the plurality of registers and data value outputted by the plurality of flip-flops.

* * * * *